US009634081B2

(12) United States Patent
Gruber et al.

(10) Patent No.: US 9,634,081 B2
(45) Date of Patent: Apr. 25, 2017

(54) METHODS FOR PRODUCING POLYSILICON RESISTORS

(71) Applicant: Infineon Technologies AG, Neubiberg (DE)

(72) Inventors: Hermann Gruber, Woerth an der Donau (DE); Thomas Gross, Sinzig (DE); Werner Irlbacher, Nabburg (DE); Markus Zundel, Egmating (DE); Mathias von Borcke, Munich (DE); Hans Joachim Schulze, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 14/048,173

(22) Filed: Oct. 8, 2013

(65) Prior Publication Data

US 2015/0099341 A1    Apr. 9, 2015

(51) Int. Cl.
*H01L 49/02*    (2006.01)
*H01L 27/08*    (2006.01)
*H01L 21/266*   (2006.01)
*G01K 7/18*     (2006.01)

(52) U.S. Cl.
CPC .............. *H01L 28/20* (2013.01); *G01K 7/186* (2013.01); *H01L 21/266* (2013.01); *H01L 27/0802* (2013.01)

(58) Field of Classification Search
CPC .... H01L 28/20; H01L 21/266; H01L 27/0802
See application file for complete search history.

(56) References Cited

U.S. PATENT DOCUMENTS

| 5,240,500 | A * | 8/1993 | Retti | E04F 21/00 106/778 |
|---|---|---|---|---|
| 5,356,825 | A * | 10/1994 | Hozumi | H01L 27/0688 148/DIG. 136 |
| 7,105,912 | B2 * | 9/2006 | Chen et al. | 257/538 |
| 7,241,663 | B2 * | 7/2007 | Howard et al. | 438/382 |
| 7,879,666 | B2 * | 2/2011 | Zhang et al. | 438/197 |
| 7,910,450 | B2 * | 3/2011 | Chinthakindi et al. | 438/382 |
| 8,072,049 | B2 * | 12/2011 | Gagne et al. | 257/665 |
| 8,361,874 | B2 * | 1/2013 | Eguchi | 438/385 |
| 8,716,827 | B2 * | 5/2014 | Benaissa et al. | 257/506 |
| 8,927,385 | B2 * | 1/2015 | Nandakumar et al. | 438/382 |
| 8,940,612 | B2 * | 1/2015 | Benaissa | 438/384 |
| 2004/0203214 | A1 * | 10/2004 | Iizuka et al. | 438/384 |
| 2006/0035426 | A1 * | 2/2006 | Weiss et al. | 438/199 |
| 2006/0166454 | A1 |  7/2006 | Coolbaugh et al. | |

(Continued)

FOREIGN PATENT DOCUMENTS

| CN | 1227659 A | 9/1999 |
|---|---|---|
| CN | 1828867 A | 9/2006 |

(Continued)

*Primary Examiner* — Bac Au
(74) *Attorney, Agent, or Firm* — Viering, Jentschura & Partner mbB (57) ABSTRACT

A method for producing a polysilicon resistor device may include: forming a polysilicon layer; implanting first dopant atoms into at least a portion of the polysilicon layer, wherein the first dopant atoms include deep energy level donors; implanting second dopant atoms into said at least a portion of said polysilicon layer; and annealing said at least a portion of said polysilicon layer.

17 Claims, 10 Drawing Sheets

(56) References Cited

U.S. PATENT DOCUMENTS

| | | | |
|---|---|---|---|
| 2007/0096183 A1* | 5/2007 | Ogawa et al. | 257/300 |
| 2010/0009510 A1* | 1/2010 | Hashimoto | 438/382 |
| 2010/0078727 A1* | 4/2010 | Min | H01L 21/84 |
| | | | 257/369 |
| 2010/0327370 A1 | 12/2010 | Jan et al. | |
| 2012/0199188 A1 | 8/2012 | Nie et al. | |

FOREIGN PATENT DOCUMENTS

| | | |
|---|---|---|
| CN | 102683480 A | 9/2012 |
| WO | 9749103 A1 | 12/1997 |

\* cited by examiner

METHODS FOR PRODUCING POLYSILICON RESISTORS

TECHNICAL FIELD

The disclosure relates to methods for manufacturing polysilicon resistors in semiconductor components, especially for producing precise polysilicon resistors, e.g. resistance temperature sensors, and for producing polysilicon resistors having well-controlled temperature coefficients.

BACKGROUND

With the introduction of the silicon planar technology, not only the active components like NMOS transistors (N-type metal-oxide-semiconductor transistors), PMOS transistors (P-type metal-oxide-semiconductor transistors) and bipolar transistors, but also the passive components like resistors are required to qualify with the silicon planar technology. The use of polycrystalline silicon, or polysilicon as it is commonly known, as a resistor, is well known in the fabrication of semiconductor devices. Generally polysilicon resistivity either increases or decreases with increasing temperature. This rate of increase is referred to as a temperature coefficient of resistance. On one hand, a precise resistor requires not only the property of stability and low-scattering, but also a relative high sheet resistance to keep the resistor as small as possible. For high-ohm resistors, which can be simply achieved by series connection of square sheets with sheet resistance of 1 kOhm/square, and the typical minimum critical dimension of such square sheet is in a range of 0.5 µm-1 µm (for example, a 500 kOhm resistor would be built up from 500 pieces of such square sheets), the resistance value of such high-ohm poly resistors produced in a conventional way varies too much with regard to the temperature, i.e. the temperature coefficient of the high-ohm poly resistors is too big, which results instability of the poly resistors. For these reasons, there is a need for minimizing the temperature dependence of a polysilicon resistor.

On the other hand, polysilicon resistors are utilized for a variety of applications, e.g. used as temperature sensors in semiconductor devices. Power transistors such as DMOS transistors (double diffused metal oxide semiconductor transistors) find multiple applications in semiconductor applications. During operation of the power transistors, a wide variety of switching states occur, in which in part very large power losses are converted into heat. Such switching states associated with large power losses are critical since the temperature rises greatly in this case and the power transistors can be destroyed by overheating. In order to protect the transistors against damage in such critical switching states, temperature sensors are often used. Ideally, the temperature sensors are positioned as close as possible to or in the cell array of the power transistor in order that a temperature rise on account of energy loss converted into heat is detected early and rapidly and that the power transistor is turned off in good time before self-destruction on account of overheating by an auxiliary circuit such as a logic circuit. In this case, a resistor situated in the cell array of the power transistor can be used as a rapidly reacting temperature sensor. The temperature sensor changes its absolute resistance value with temperature in the characteristic manner, in which case it is possible to derive a turn-off signal for turning off the power transistor when a defined maximum permissible resistance value is reached. Therefore, an obvious variation of resistance according to temperature increasing is required for such polysilicon resistance temperature sensors. For these reasons, there is a need for enlarging the temperature dependence of a polysilicon resistance temperature sensor in certain applications. However, this concept with a resistance temperature sensor often fails in practice because of excessively large manufacturing variations with which a resistance temperature sensor of this type can be produced, since the absolute value of the resistance cannot be used as a turn-off threshold meaningfully. For these reasons, there is a need for minimizing the manufacturing-variations dependence of such polysilicon resistance temperature sensor.

Thus, there is a need in the art to provide methods for manufacturing poly resistors precisely and in the meantime, for manufacturing poly resistors with well-controlled temperature coefficients.

BRIEF SUMMARY

In accordance with one or more embodiments, a method for producing a polysilicon resistor device may include: forming a polysilicon layer; implanting first dopant atoms into at least a portion of said polysilicon layer, wherein the first dopant atoms comprise deep energy level donors; implanting second dopant atoms into said at least a portion of said polysilicon layer; and annealing said at least a portion of said polysilicon layer after implanting the first and second dopant atoms.

In accordance with one or more embodiments, a method for producing a polysilicon resistor device may include: forming a polysilicon layer; forming an implantation mask over said polysilicon layer exposing a pre-defined subarea of said polysilicon layer; implanting dopant atoms into said pre-defined subarea of said polysilicon layer through said implantation mask; and creating diffusion of said dopant atoms, wherein said dopant atoms diffuse at most within said polysilicon layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "front," "back," "leading," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

Polysilicon resistor device fabrication involves performing a variety of processes, procedures and operations in order to achieve a fabricated device. These operations include, but are not limited to, layering, doping, heat treatments, and patterning.

Layering is the operation used to add layers of a selected thickness to a wafer substrate. These layers can be insulators, semiconductors, conductors, and the like and can be grown or deposited by a number of suitable methods (e.g., chemical vapor deposition, sputtering, and the like). Doping is the process that introduces specific amounts of dopants in the wafer surface through openings in the surface layers. Typical technique used for doping is, e.g. ion implantation. Doping is used, for example, to create active regions in transistors or to created resistivity regions in resistors. Heat treatments are operations in which a complete wafer or a portion of a wafer is heated and hold at a predefined temperature (range) for some pre-determined time to achieve specific results. A common heat treatment is called an annealing which is typically employed to repair defects in crystal structures introduced by ion implantation. Patterning is the operation that employs a series of steps that result in the removal of selected portions of added surface layers. The series of steps includes first forming a layer of resist or photoresist over a polysilicon resistor device. Then a resist mask is aligned with the device. Subsequently, the layer of resist is exposed or irradiated through the resist mask, which selects portions of layer of resist that are later removed to expose underlying portions of the device. Continuing, a fabrication process, such as ion implantation, ion diffusion, and the like is performed on exposed portions of the device.

For example, the prevalent processes for producing a high-ohm polysilicon resistor in the market nowadays typically include: depositing an undoped polysilicon layer over an insulating layer of a silicon substrate, the undoped polysilicon layer is typically in a thickness range of 200 nm to 400 nm; then implanting dopant atoms into the polysilicon layer with a subsequent annealing step, which defines the resistance of the polysilicon resistor.

Figure 1:
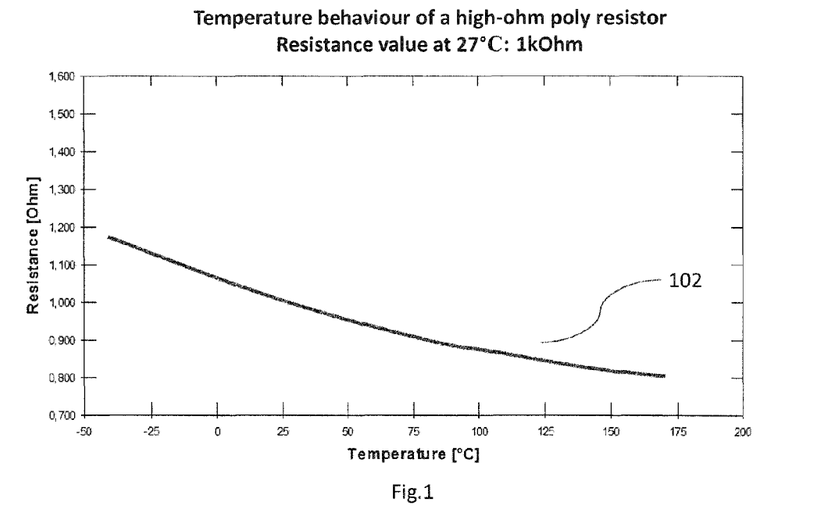
FIG. 1 is a graphical representation of the temperature behavior of a high-ohm poly resistor produced according to a conventional method.

Generally, polysilicon resistivity either increases or decreases with increasing temperature. This rate of increase is referred to as a temperature coefficient of resistance. FIG. 1 illustrates the temperature behavior of a high-ohm resistor produced according to the general process mentioned above. The high-ohm poly resistor has a resistance value of 1 kOhm at room temperature (27° C.), and the resistance value decreases significantly as the working temperature increases, i.e. the high-ohm poly resistor has a negative temperature coefficient, however the temperature coefficients has a large absolute value which is not appropriate for a resistor device in some applications.

The following embodiments provide methods for improving the temperature behavior of polysilicon resistors, more specifically, for stabilizing the temperature behavior of the resistance.

According to an aspect of one or more embodiments described in the following, first dopant atoms including deep energy level donors may be implanted into at least a portion of a polysilicon layer. In one or more embodiments, implanting the first dopant atoms may at least partially amorphize the at least a portion of the polysilicon layer. The deep energy level donors (also referred as deep level donors or deep energy donors) implanted into the polysilicon layer may inhibit a full recrystallization of said at least a portion of the polysilicon layer during a later annealing process. In one or more embodiments, an energy difference between the deep energy donors and the conduction band edge (e.g., an energy difference between an energy level of the deep energy donors (e.g. an energy level of the band structure of the doped polysilicon layer provided by the deep energy donors) and an energy level of the conduction band edge (e.g. an energy level of the conduction band edge in the doped polysilicon layer, e.g. an energy level of the lower edge of the conduction band in the band structure of the doped polysilicon layer) may be higher than 200 meV. In one or more embodiments, such deep energy donors can be selenium atoms, sulfur atoms or nitrogen atoms.

According to another aspect of one or more embodiments described in the following, second dopant atoms may be implanted into said at least a portion of the polysilicon layer. In one or more embodiments, the second dopant atoms can be different dopant atoms than the first dopant atoms. In one or more embodiments, the second dopant atoms may be dopant atoms with a shallow energy level (also referred as shallow donors). Such shallow donors may exhibit a small difference between an energy level of the doping atoms and the conduction band edge; for example, a difference smaller than 100 meV according to one or more embodiments. In one or more embodiments, the second dopant atoms may include or may be phosphorous atoms or arsenic atoms.

In one or more embodiments, implanting the second dopant atoms may be carried out after implanting the first dopant atoms. In one or more embodiments, implanting the second dopant atoms may be carried out before implanting the first dopant atoms. In one or more embodiments, implanting the first dopant atoms and implanting the second dopant atoms may be carried out at the same time.

In accordance with various embodiments, an annealing process may be carried out after the first and second dopant atoms have been implanted into the polysilicon layer.

Figure 2A:
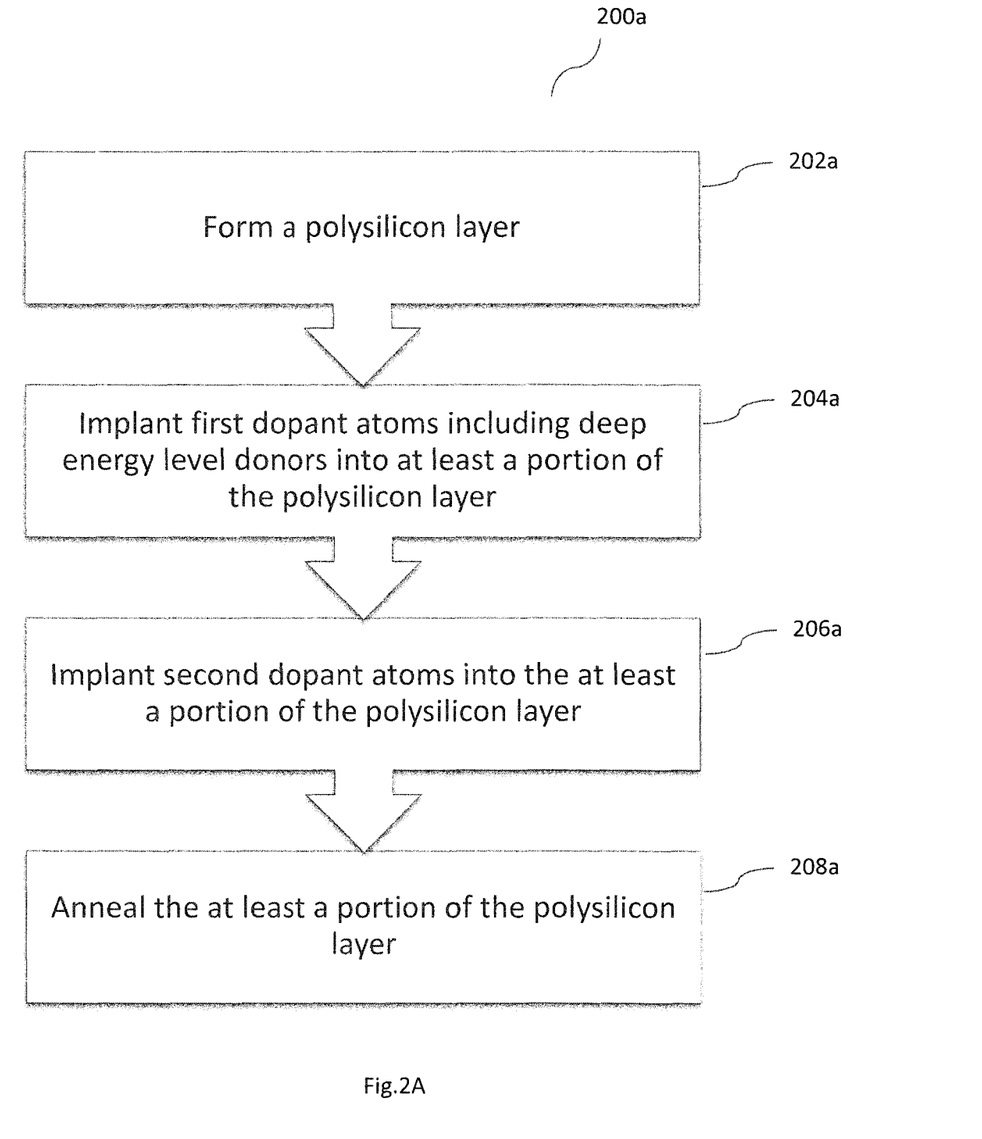
FIG. 2A is a flow diagram illustrating a method of fabricating a polysilicon resistor device in accordance with an aspect of the present disclosure.

FIG. 2A is a flow diagram illustrating a method 200a of fabricating a polysilicon resistor device in accordance with an aspect of the present disclosure. The method 200a includes forming a polysilicon layer (in 202a); implanting first dopant atoms into at least a portion of the polysilicon layer (in 204a), wherein the first dopant atoms include deep energy level donors; implanting second dopant atoms into the at least a portion of said polysilicon layer (in 206a); and (in 208a) annealing the at least a portion of said polysilicon layer after implanting the first and second dopant atoms.

Figure 2B:
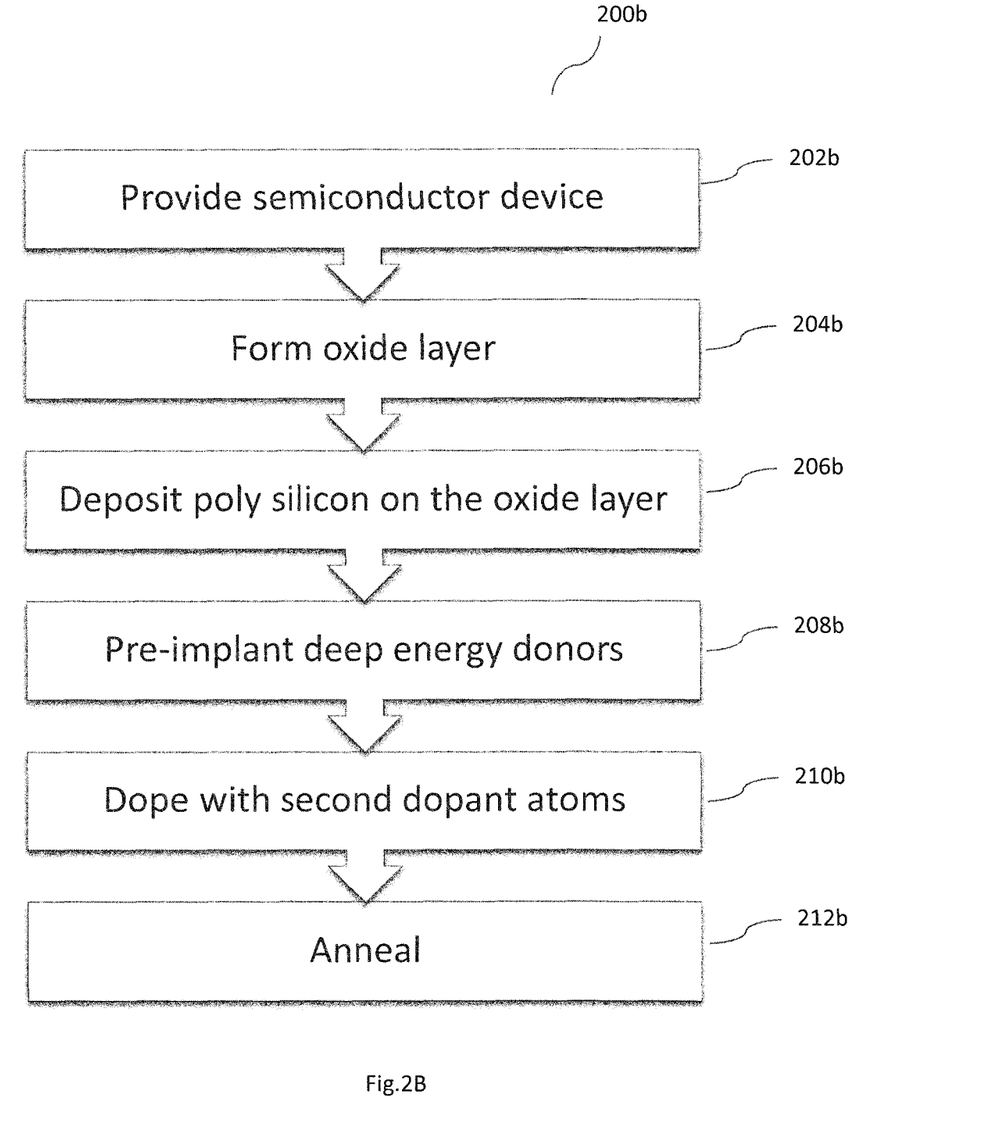
FIG. 2B is a flow diagram illustrating a method of fabricating a low temperature coefficient polysilicon resistor in accordance with an aspect of the present disclosure.

FIG. 2B is a flow diagram illustrating a method 200b of forming a polysilicon resistor with relatively smaller temperature coefficients in accordance with an aspect of the present disclosure. The method 200b pre-implants deep energy level donors into the polysilicon resistor before optionally additionally any of the typical or customary doping implantation is performed. The pre-implantation changes the crystal structure of the polysilicon, rendering it amorphous or at least strongly damaged depending upon the energy of implantation. The pre-implanted atoms affect the recrystallization characteristics of the polysilicon during annealing, resulting for example in a partial recrystallization of the amorphized structure, with the result that the temperature behavior of the polysilicon can be selectively altered. More particularly, as shown, method 200b results in a stabilized temperature behavior of the polysilicon resistor.

The method 200b begins at block 202b, wherein a semiconductor device/body is provided. The semiconductor device can have other devices, including DMOS transistor devices, capacitors, and the like that are partially fabricated. An oxide layer is formed over the device at block 204b. The oxide layer serves to protect underlying layers, which can include active components, semiconductor substrate, and the like. A polysilicon layer is deposited over the oxide layer at block 206b and has a selected thickness. Typically, the thickness of a polysilicon layer is in a range of between 200 nm-400 nm. The polysilicon layer can be formed as undoped or lightly-doped by incorporating a dopant during deposition.

Optionally, an implantation mask is applied to the semiconductor device that exposes a selected portion and/or percentage of the polysilicon layer while covering other portions of the polysilicon layer (not shown in FIG. 2B), so that only the exposed region of the polysilicon layer is implanted subsequently. The amount or percentage of the polysilicon exposed by the implantation mask is determined based on a desired dopant concentration, the selected thickness of the polysilicon layer, and dopant species and dose employed in later implantation.

Figure 3A:
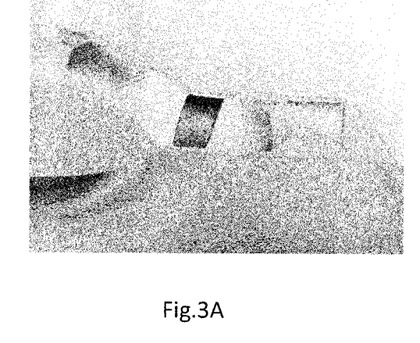
FIG. 3A shows a grain structure of crystallized polysilicon.
Figure 3B:
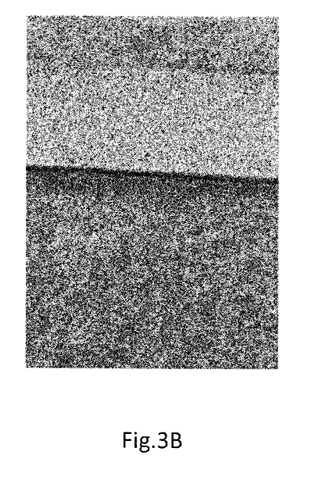
FIG. 3B shows a grain structure of amorphized polysilicon.

Continuing the method 200b at block 208b, deep energy level donors are pre-implanted into the exposed portions of the polysilicon layer, so that polymer behavior of the polysilicon is optimized. More specifically, the grain structure of the polysilicon is amorphized or at least partially amorphized via pre-implanting deep energy donors. The deep energy atoms are selected from substances that can create deep level defects. Particularly suitable deep energy level donors comprise, e.g. selenium atoms, nitrogen atoms or sulfur atoms; such deep energy level defects result in an effective doping concentration increasing with temperature and a significant reduced Schottky resistance. Typical pre-implantation dose lies in a range of between $1 \times 10^{15}$ cm$^{-2}$ and $5 \times 10^{15}$ cm$^{-2}$. FIG. 3A shows an example of the original crystalline grain structure of polysilicon, while FIG. 3B illustrates the grain structure of polysilicon been amorphized.

Optionally, pre-implantation includes pre-implanting second dopant atoms additionally (not shown in FIG. 2B). The second dopant atoms are typically selected from e.g., phosphorus atoms.

Then, any actual doping (where such doping would typically take place) may be performed through the exposed portions of the poly resistor with second dopant atoms at block 210b. The second dopant atoms contribute to the resistivity/conductivity of the polysilicon resistor. The second dopant atoms employed in the implant are typically phosphorous atoms, with a typical implantation dose in the range of between $3 \times 10^{14}$ cm$^{-2}$ and $4 \times 10^{14}$ cm$^{-2}$, and implantation energy of 40 keV.

Optionally, metal contacts are formed at ends of the polysilicon resistor (not shown in FIG. 2B). The contacts are formed of a conductive material, such as aluminum, tungsten or copper, and provide electrical communication to other electronic components. In one embodiment, the end region of the polysilicon resistor, where the contacts are positioned, is highly-doped compared to the central region of the poly resistor, thereby to have relatively little electrical resistance. A typical phosphorous implantation energy of 40 keV with implantation dose of $2.7 \times 10^{15}$ cm$^{-2}$ are applied to the contact region of the poly resistor. Then, the implantation mask (e.g. resist mask) is removed by a suitable process, e.g. a suitable resist removal process.

Subsequently, a thermal activation process comprising an annealing is performed at block 212b that activates and diffuses dopants implanted within the polysilicon resistor. As the implanted nitrogen highly effects the crystalline structure of the polysilicon and results in a highly disordered crystal structure, rendering the subsequent annealing process capable of recrystallizing the amorphized region partially, so as to control the conductivity/resistivity of the resistor to a required level. Subsequently, fabrication of the polysilicon resistor and the device continues with other processes including, but not limited to, contact formation.

Figure 4:
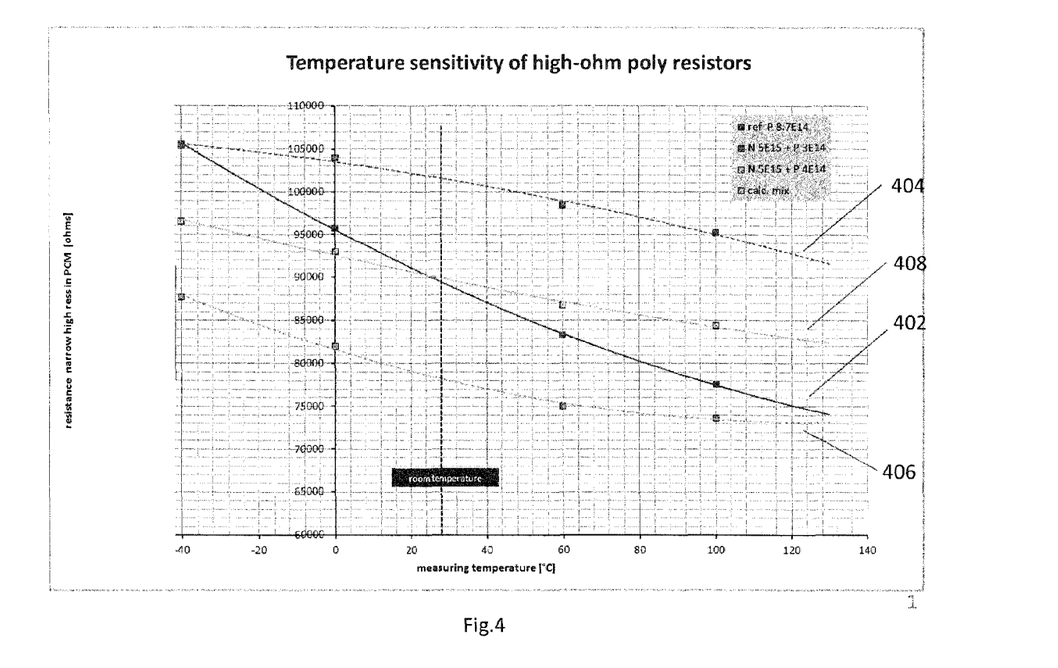
FIG. 4 is a graphical representation of the temperature behavior of poly resistors produced in accordance with some aspects of the present disclosure.

Graphical representations of the temperature behavior of high-ohm poly resistors produced according to the above methods are illustrated in FIG. 4, wherein curve 402 represents a temperature behavior of a high-ohm poly resistor produced in a conventional method, more specifically, the high-ohm poly resistor is produced merely with actual doping step, with a phosphorous implantation dose of $8.7 \times 10^{14}$ cm$^{-2}$; curve 404 represents a temperature behavior of a high-ohm poly resistor produced according to one aspect of the current disclosure, more specifically, with pre-implantation of nitrogen in a dose of $5 \times 10^{15}$ cm$^{-2}$ and doping of phosphorous in a dose of $3 \times 10^{14}$ cm$^{-2}$; curve 406 represents a temperature behavior of a high-ohm poly resistor produced according to one aspect of the current disclosure, more specifically, with pre-implantation of nitrogen in a dose of $5 \times 10^{15}$ cm$^{-2}$ and doping of phosphorous in a dose of $4 \times 10^{14}$ cm$^{-2}$; and curve 408 is a mixed calculation result of the temperature behavior showed as curve 404 and curve 406. As illustrated in FIG. 4, over the same temperature range (from −40° C. to +120° C.), the resistance value of the poly resistors produced with pre-implantation of deep energy donors (curves 404, 406 and 408) is more stable compared to the poly resistor produced without pre-implantation (curve 402), and the temperature coefficients of the poly resistors produced with pre-implantation are almost only half as the temperature coefficient of the poly resistor produced without pre-implantation.

In one implementation of the present disclosure, the method is applied in a polysilicon layer having a thickness of 200 nm. With a pre-implantation energy of 50 keV and a nitrogen dose of $5 \times 10^{15}$ cm$^{-2}$, the entire polysilicon layer is amorphized.

In some embodiments, in order to stabilize the temperature coefficients of high-ohm poly resistors, undoped polysilicon is pre-amorphized using nitrogen pre-implantation, and the high proportion of nitrogen in the polysilicon inhibits the grain growth during subsequent annealing. While the pre-amorphization and subsequent annealing yield their intended effects of a reduced carrier mobility by an enhanced scattering at lattice defects, the temperature coefficients of the poly resistor may thus be independently or partially independently controlled, which can lead to a resistor with more stable temperature responses.

One typical implementation of the present disclosure for producing a poly resistor is presented below: first, a polysilicon layer with a required thickness, e.g. 200 nm-400 nm, is deposited in, e.g. a LPCVD (Low Pressure Chemical Vapor Deposition) furnace; then pre-implantation of nitrogen atoms is carried out for amorphizing the polysilicon, with an implantation dose of $5 \times 10^{15}$ cm$^{-2}$ and an implantation energy of 50 keV; subsequently, the actual or typical doping with phosphorous atoms is performed for setting the sheet resistance of the polysilicon to 1 kOhm/square, and the implantation energy is set to 40 keV with an implantation dose of $3.5 \times 10^{14}$ cm$^{-2}$; further, the end region of the polysilicon layer where the contacts are formed is high-doped with phosphorous atoms to have a rather little electrical resistance, and the implantation energy is set to 40 keV with an implantation dose of $2.7 \times 10^{15}$ cm$^{-2}$; optionally, the polysilicon layer is cut into required shape by e.g. lithography; at last, an annealing is performed to partially activate the conductivity dopants in the polysilicon layer, since the high percentage of pre-implanted nitrogen inhibits the recrystallization of the grain structure resulting in a temperature stable reduced mobility of free charge carriers.

In some embodiments, deep defects are created in order to reduce the Schottky barrier created in the polysilicon-metal contact region, so as a more reliable ohmic contact can be formed. To form such ohmic contact (or low resistance exhibiting ohmic properties), the Schottky barrier height should be small everywhere. Creation of deep energy level defects can reduce the Schottky barrier, wherein the deep defects can be formed by pre-implantation of deep energy level donors, e.g. selenium into the contact region.

The following embodiments provide methods for improving the temperature behavior of polysilicon resistors, more specifically, for improving the temperature behavior of the resistance.

Figure 5:
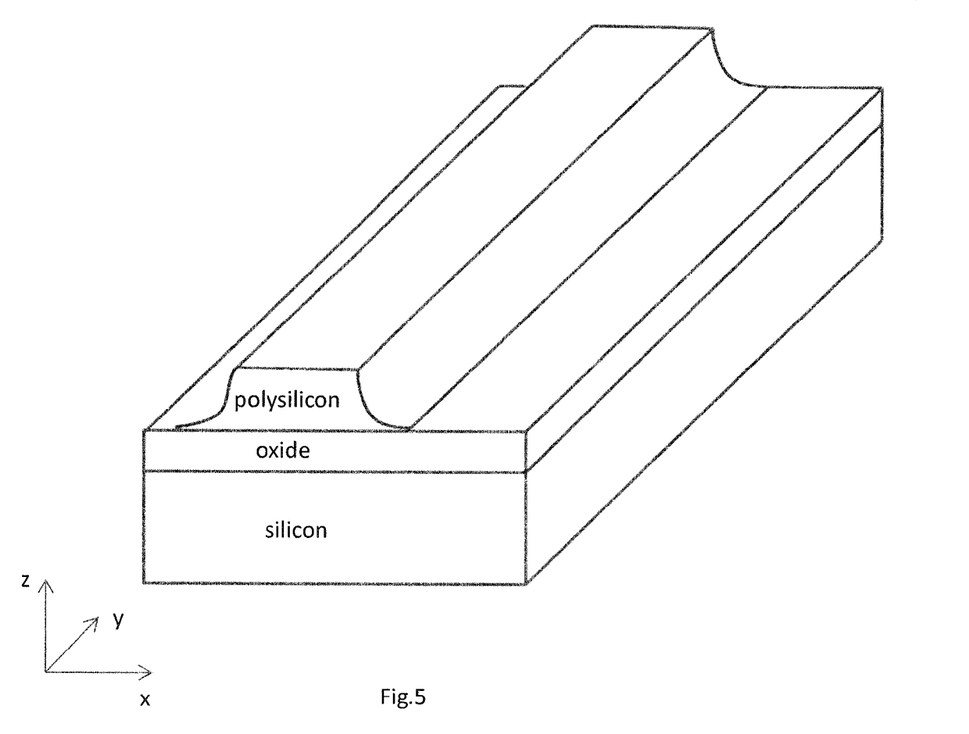
FIG. 5 is a sectional and perspective view of a polysilicon resistance temperature sensor produced according to an aspect of the present disclosure.
Figure 6:
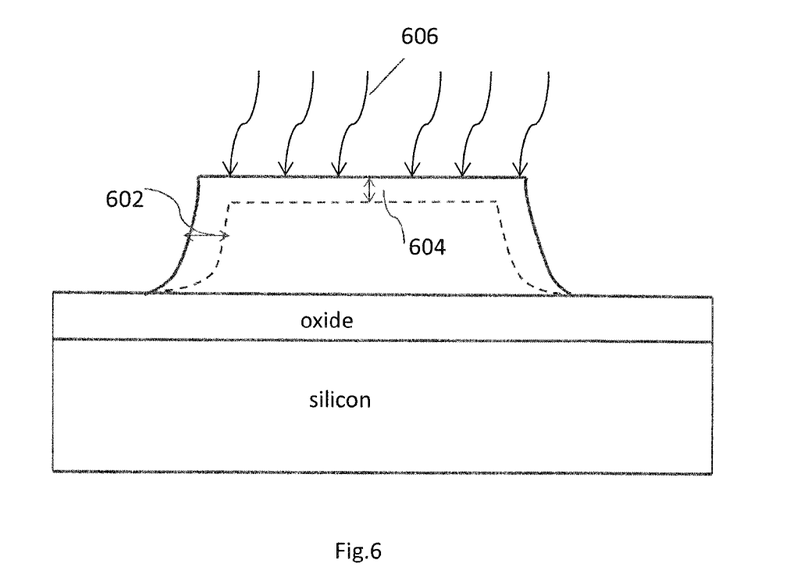
FIG. 6 is a cross-section view of a polysilicon resistance temperature sensor with manufacturing fluctuation in a prior art.

It is well known in the prior art using polysilicon resistors as temperature sensors in semiconductor devices. Conventionally, polysilicon resistance temperature sensors are positioned as close as possible to or in the cell array of a power transistor in order to detect the temperature rising early and rapidly. The absolute resistance value of a polysilicon resistor is determined by the dopants implanted into the resistor and subsequent annealing. It is noted that the dopants implanted into the resistor normally do not entirely contribute to the resistance of polysilicon resistor, since the dopants may diffuse into the other layers beneath/above the polysilicon layer, and their mobility may be reduced in the surface and boundary regions. In some embodiments, the polysilicon resistance temperature sensor is produced in a stripe shape as illustrated in FIG. 5. The longitudinal direction of the stripe lies in y-axis, the width of the cross section of the strip lies in x-axis, and the depth of the cross section of the strip lies in z-axis. While the dopants fulfill the polysilicon stripe, the dopants which actually contribute to the conductivity of the resistor may fluctuate among a plurality of polysilicon stripes, even with the same implantation and annealing setting, since the surface/boundary of the poly stripes may have size fluctuations due to the manufacturing imprecision. In other word, the absolute resistance value of a polysilicon resistor varies with the fluctuation of the resistor' structure and doping. For example, as illustrated in FIG. 6, in the conventional manufacturing procedure, typical width fluctuation of a polysilicon resistor stripe with a thickness of about 1 μm is ±500 nm (shown as double-arrow 602 in FIG. 6), the fluctuation of the thickness of the poly resistor is about ±10% (shown as double-arrow 604 in FIG. 6), while the self-doping can be adjusted accurately to about ±8% relative to the dose (shown as 606 in FIG. 6). For a plurality of poly resistor applications, the fluctuation of the poly width and thickness introduced by the manufacture would therefore be negligible. However, much of the space on the chip may be lost due to the fluctuation of the poly resistor width (typical width of a poly resistor lies in the ranges of 30 μm-100 μm). Further, the conventional methods would fail to produce high accuracy poly resistors, e.g. a polysilicon resistance temperature sensor with the fluctuation of the resistance value lies within ±5%.

One or more embodiments provide methods of manufacturing polysilicon resistance temperature sensors, with more accurate resistance.

According to an aspect of one or more embodiments described in the following, dopant atoms may be implanted through an implantation mask into a pre-defined subarea of a polysilicon layer. Subsequently, diffusion of said dopant atoms may be created (for example, by annealing at least the subarea of the polysilicon layer), wherein said dopant atoms diffuse at most within said polysilicon layer. In one or more embodiments, the dopant atoms may diffuse at most within a portion of the polysilicon layer. For example, in one or more embodiments, the diffusing dopant atoms may not reach a boundary of the polysilicon layer.

Figure 7A:
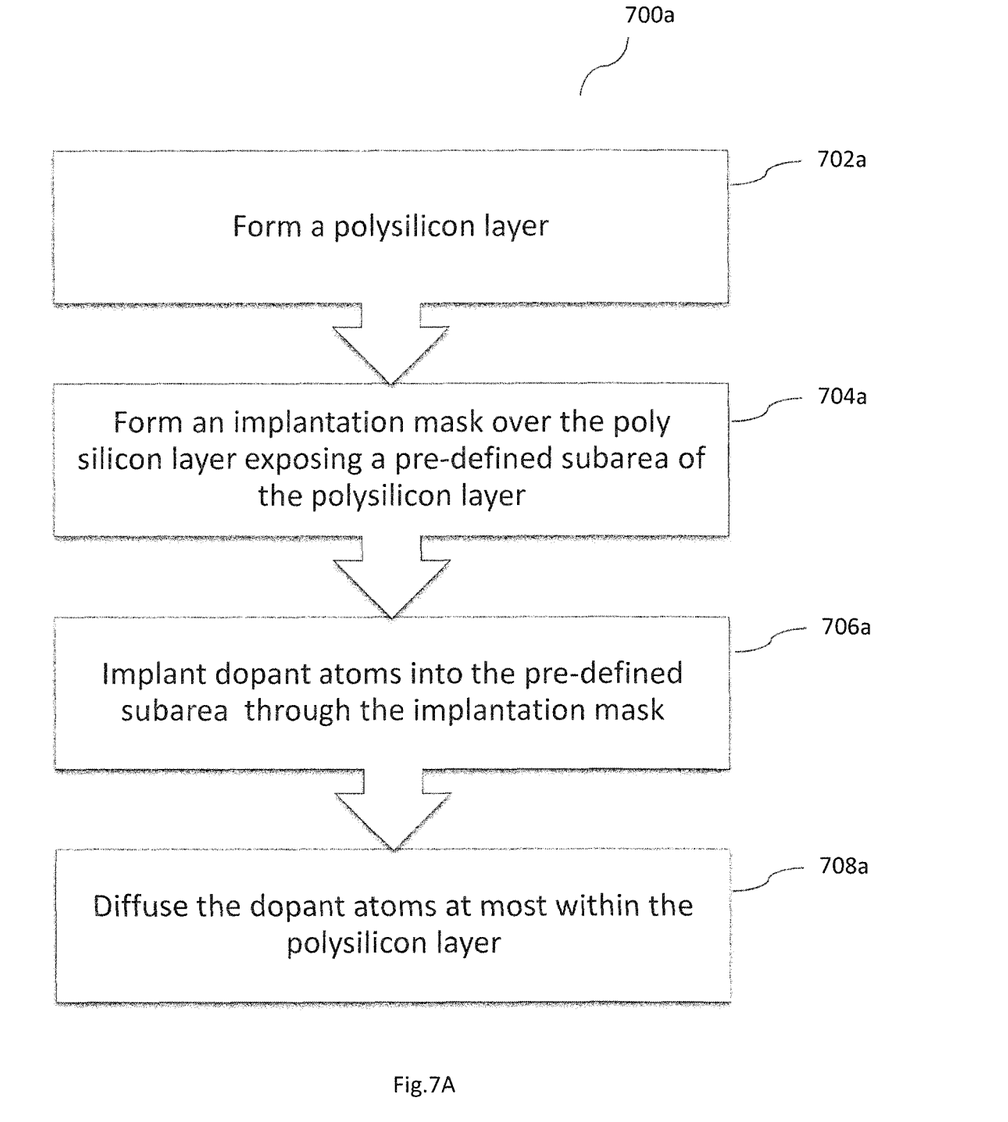
FIG. 7A is a flow diagram illustrating a method of fabricating a polysilicon resistor device in accordance with an aspect of the present disclosure.

FIG. 7A is a flow diagram illustrating a method 700a of fabricating a polysilicon resistor device in accordance with an aspect of the present disclosure. The method 700a includes: forming a polysilicon layer (in 702a); forming an implantation mask over the polysilicon layer exposing a pre-defined subarea of the polysilicon layer (in 704a); implanting dopant atoms into the pre-defined subarea of the polysilicon layer through the implantation mask (in 706a); and creating diffusion of the dopant atoms, wherein the dopant atoms diffuse at most within the polysilicon layer (in 708a).

Figure 7B:
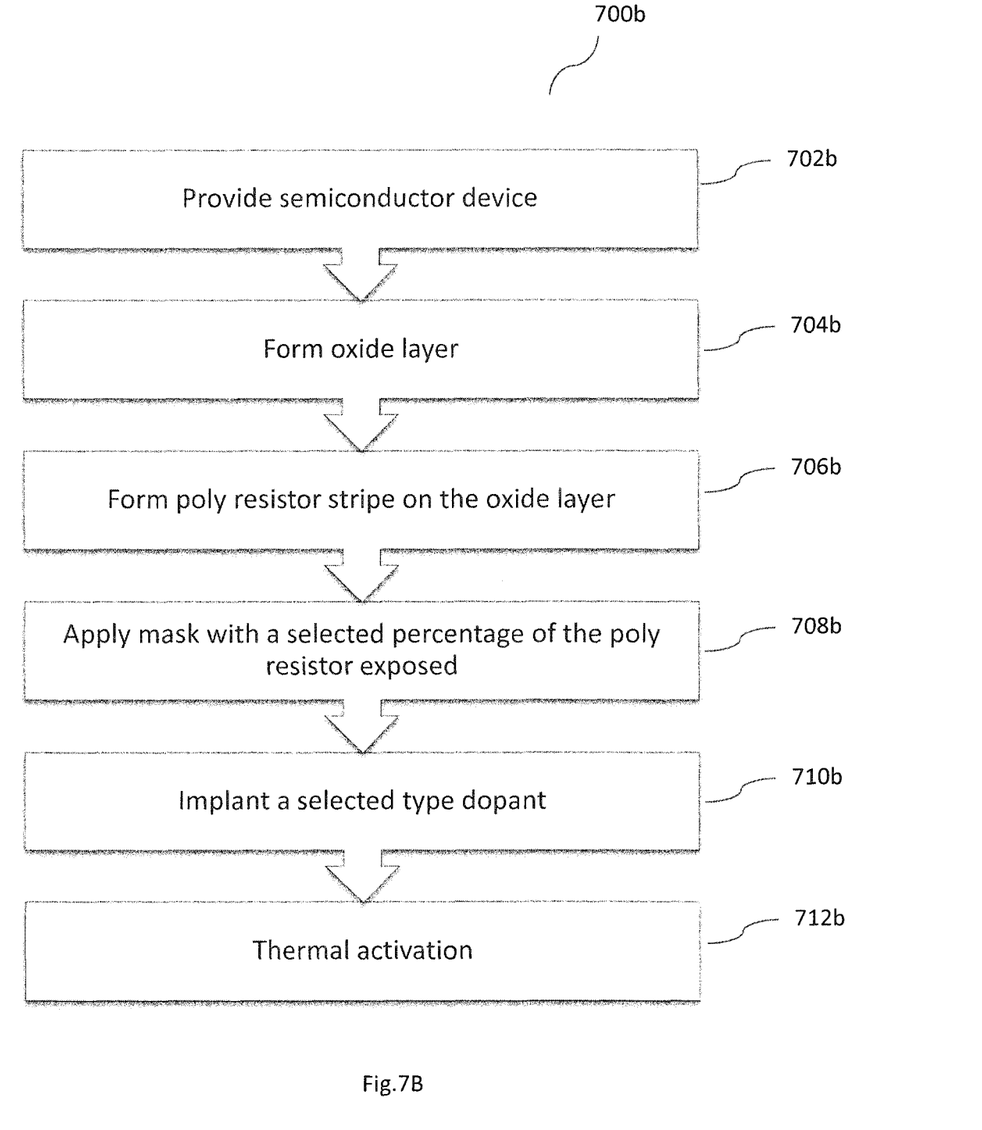
FIG. 7B is a flow diagram illustrating a method of fabricating a precise polysilicon resistance temperature sensor in accordance with an aspect of the present disclosure

FIG. 7B is a flow diagram illustrating a method 700b of fabricating a polysilicon resistance temperature sensor in accordance with an aspect of the present disclosure. Generally, the absolute resistance value of polysilicon resistor varies as a result of manufacturing variations, such as in the cross-sectional profile of the polysilicon structure. The method 700b mitigates this affect by polysilicon masking and doping a subset of the polysilicon, creating a sensor in a controlled volume, such as in the central region of the polysilicon.

Beginning at block 702b, a semiconductor device/body is provided. The semiconductor device can have other devices, including DMOS power transistors, capacitors, and the like that are partially fabricated. An oxide layer that may be formed over the device at block 704b serves to protect underlying layers, which can include active components, semiconductor substrate, and the like and also to electrically isolate the polysilicon resistor. A polysilicon stripe may be formed on the oxide layer at block 706b having a selected thickness. The polysilicon stripe may be formed as undoped polysilicon. The thickness of the polysilicon stripe is typically selected according to other components, such as polysilicon gate layers, formed on the device. An implantation mask (e.g., resist mask) applied to the semiconductor device at block 708 may be configured to expose a selected portion and/or percentage of the polysilicon resistor in the central region while covering other portions of the resistor and other components on the device, so that only the exposed region of the polysilicon is implanted by subsequent processes. The amount or percentage of the polysilicon exposed by the implantation mask (e.g. resist mask) may be determined based on a desired dopant concentration, a selected thickness of the polysilicon stripe, and dopant species and dose employed in later ion implantation, so that the dopants implanted subsequently will not diffuse out of the stripe. A selected type dopant is then implanted into the exposed portions of the polysilicon stripe at block 710b. Since ion implantation can be set with a very good accuracy (typically ±2%) regarding to the implantation dose, thus the doping concentration into the poly stripe is possible to be set very precisely. Subsequently, the implantation mask (e.g., resist mask) may be removed. A thermal activation process is performed at block 712b that activates and diffuses dopants implanted within the polysilicon stripe. The thermal treatment may include an annealing process which is able to activate the implanted dopants almost 100% electrically.

With this provided method, the dopants are only introduced in the central region of the polysilicon stripe, and will not suffer from surface/boundary effects. Therefore, these dopants completely contribute to the resistivity of the polysilicon resistance temperature sensors. Since the fluctuation of resist mask size can be controlled within 1%-2%, and ion implantation dose has an error range about 2%-3%, consequently, a total variation of less than 5% regarding to the resistance value can be achieved.

Figure 8A:
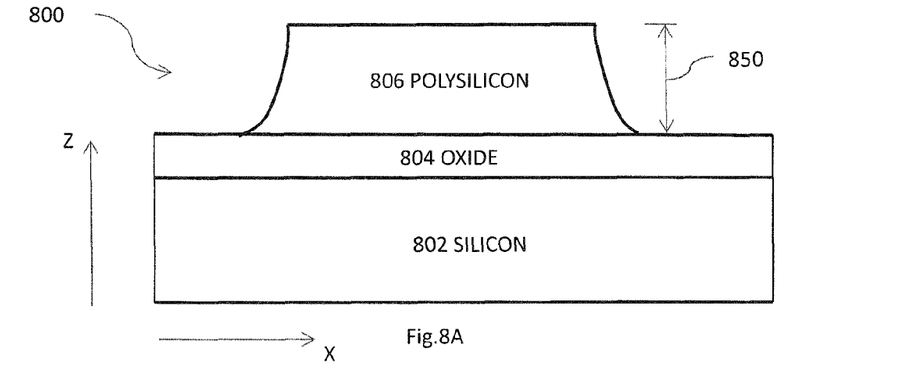
FIG. 8A depicts the polysilicon resistance temperature sensor after formation of a polysilicon layer in accordance with an aspect of the present disclosure.
Figure 8B:
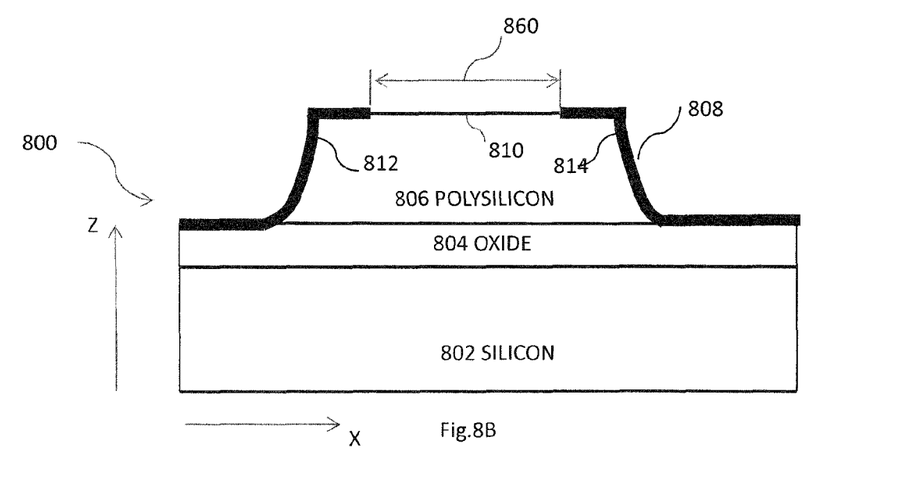
FIG. 8B depicts the polysilicon resistance temperature sensor after formation of a implantation mask in accordance with an aspect of the present disclosure.
Figure 8C:
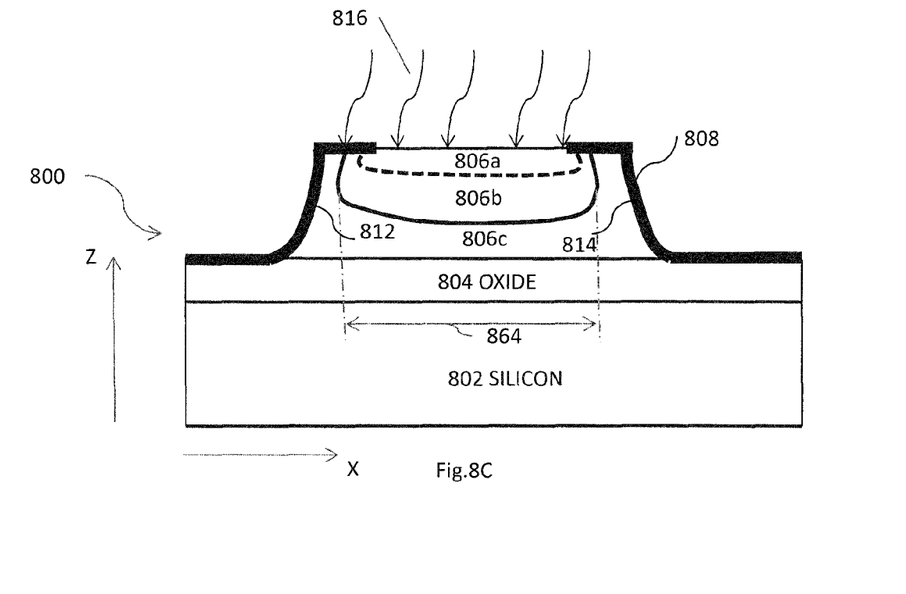
FIG. 8C depicts the polysilicon resistance temperature sensor after doping and diffusion in accordance with an aspect of the present disclosure.

FIGS. 8A, 8B and 8C depict a polysilicon resistor device 800 being fabricated according to one aspect of the current disclosure. The device 800 as shown is provided and described to facilitate understanding of the present disclosure and is exemplary in nature.

FIG. 8A depicts the polysilicon temperature sensor after formation of a polysilicon stripe 806 in accordance with an aspect of the present disclosure. The polysilicon stripe 806 may be formed on an oxide layer 804 by a suitable deposition process, while the oxide layer 804 is shown over a semiconductor substrate or body 802 comprised of silicon. The thickness 850 of the deposited polysilicon stripe 806 may be chosen to be large enough, so that the oxide layer 804 cannot be reached by the subsequent diffusion of the dopant in further steps, and thus the oxide layer 804 is segregated from the dopants.

FIG. 8B illustrates the polysilicon resistor device 800 after formation of mask 808 exposing a central portion of the polysilicon stripe 806 in accordance with an aspect of the present disclosure. The resist mask 808 has an opening 810. The opening 810 is typically uniformly spaced along the polysilicon stripe 806 so as to facilitate uniform dopant distribution of implanted dopants in the longitudinal direction (y-direction) of the poly resistor 806. The width 860 of the opening 810 can be varied. In one embodiment, the width 860 is set to size $X_1$ to make sure the lateral diffusion range 864 of the subsequent implanted species in the lateral direction (x-direction) is within the region between two side flanks 812 and 814 of the poly stripe 806, or even has a significant distance away from the flanks. Then the fluctuation of the stripe width and thickness are eliminated for determining the absolute resistance value of the poly stripe, and the width 860 of mask opening 810 is now the critical dimension of the poly resistor, while the masking technology has merely a 1%-2% error range impact.

FIG. 8C illustrates the polysilicon temperature sensor 800 after ion implantation 816 in accordance with an aspect of the present disclosure. The dopants can merely pass through the opening 810, but are resisted in other portions by the resist mask 808. As a result, only a portion of the ions directed at the opening 810 are implanted into the polysilicon resistor, forming an implanted region 806a. Subsequent to the ion implantation 816, the resist mask 808 is removed by a suitable process (e.g., chemical solution). Then, a thermal activation process is performed that diffuses the implanted dopants more uniformly through the polysilicon stripe 806, forming a diffused region 806b.

Accordingly, the poly stripe 806 is shown composed of an implanted region 806a, a diffused region 806b and an undoped region 806c. The absolute resistance value of the poly stripe 806 is merely determined by the masking 808 (or the opening 810), and doping dose and energy, and the influence from the fluctuation of the structure of poly stripe 806 to the absolute resistance value is eliminated. Further, since the thickness and lateral size of the poly stripe 806 are significantly larger than the diffusion scope of the implanted dopant, no dopant can diffuse away from the poly stripe 806, reducing or eliminating dopant that may become electrically inactive due to surface/boundary effects (e.g. space charge zone, the interstitial space, etc.), and such that fewer or no charge carriers may suffer a decreased mobility due to surface roughness of the stripe 806. Therefore, with the above exemplary embodiment, the size and shape of the poly stripe may now be independent of the resistance value. Stated another way, the effective cross-section of the device may be limited to a subset of the gross stripe cross-section, with the result that the profile of the deposited stripe does not define the resistance value of poly stripe any more, whereas the now undoped region 806c would have led to potentially undefined conditions and unwanted process variations, or variations that present a greater practical challenge to control.

Figure 9A:
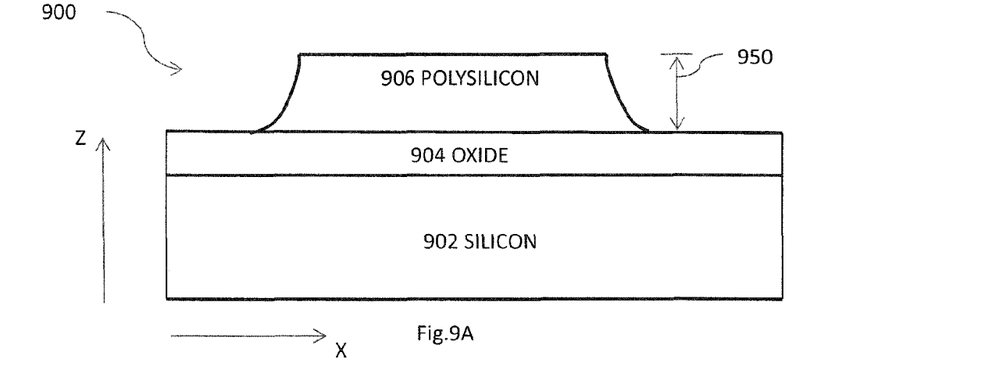
FIG. 9A depicts the polysilicon resistance temperature sensor after formation of a polysilicon layer in accordance with an aspect of the present disclosure.
Figure 9B:
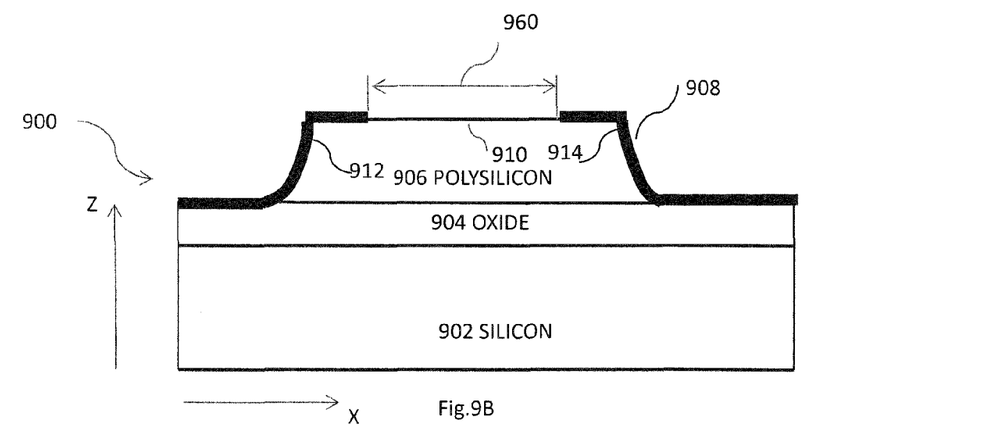
FIG. 9B depicts the polysilicon resistance temperature sensor after formation of an implantation mask in accordance with an aspect of the present disclosure.
Figure 9C:
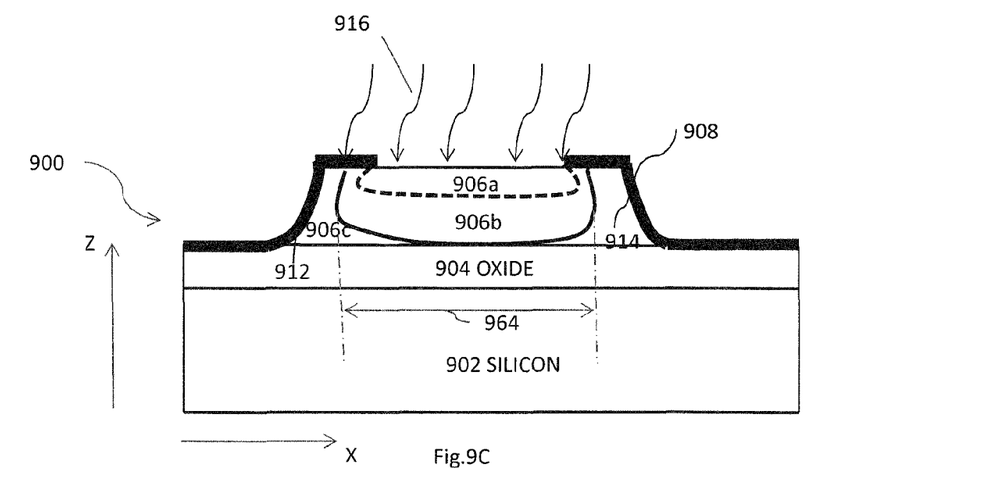
FIG. 9C depicts the polysilicon resistance temperature sensor after doping and diffusion in accordance with an aspect of the present disclosure.

FIGS. 9A, 9B and 9C depict a polysilicon resistance temperature sensor 900 being fabricated according to one aspect of the present disclosure. The device 900 provided in FIG. 9 is different from the device 800 illustrated in FIG. 8 in the polysilicon stripe thickness, and leads to a reduction of undefined and unwanted region in the poly stripe.

FIG. 9A depicts the polysilicon resistance temperature sensor after formation of a polysilicon stripe 906 in accordance with an aspect of the present disclosure. The polysilicon stripe 906 is shown formed on an oxide layer 904 by a suitable deposition process, while the oxide layer 904 is shown over a semiconductor substrate or body 902 comprised of silicon. The thickness 950 of the deposited polysilicon stripe 906 is not necessarily larger than the diffusion depth of the dopants that may be implanted subsequently, since a dopant specie which barely diffuses into the oxide layer 904 is selected, e.g. such dopant atoms can be arsenic atoms, phosphorus atoms and etc.

FIG. 9B illustrates the polysilicon resistance temperature sensor 900 after formation of mask 908 exposing a central portion of the polysilicon stripe 906 in accordance with an aspect of the present disclosure. The resist mask 908 is shown having an opening 910. The opening 910 is typically uniformly spaced along the polysilicon resistor 906 so as to facilitate uniform dopant distribution of implanted dopants in the longitudinal direction (y-direction) of the poly stripe 906. The width 960 of the opening 910 can be varied. In one embodiment, the width 960 is set to size $X_1$ to make sure the lateral diffusion range 964 of the subsequent implanted species in the lateral direction (x-direction) is within the region between two flanks 912 and 914 of the poly stripe 906, or even has a significant distance away from the flanks. Then the fluctuations of the stripe width and thickness are eliminated for determining the absolute resistance value of the poly stripe, and the width 960 of mask opening 910 is now the critical dimension of the poly stripe, while the masking technology has merely a 1%-2% error range impact.

FIG. 9C illustrates the polysilicon resistance temperature sensor 900 after ion implantation 916 in accordance with an aspect of the present disclosure. The ion implantation 916 implants a selected type of dopants, which will not diffuse significantly into the oxide layer 904 beneath the polysilicon stripe 906. Typical such dopants can be, e.g. arsenic atoms, or phosphorus atoms. The dopants pass through the opening 910, but are resisted in other portions by the resist mask 908. As a result, only a portion of the ions directed at the opening 910 are implanted into the polysilicon resistor, forming an implanted region 906a. Subsequent to the implantation 916, the resist mask 908 is removed by a suitable process (e.g., chemical solution). Then, a thermal activation process is performed that diffuses the implanted dopant more uniformly through the polysilicon stripe 906, forming a diffused region 906b.

Since the selected dopants cannot diffuse significantly into the oxide layer 904, the diffused region 906b may reach as far as the surface of the oxide layer 904, which leads to a reduction of the unwanted and undefined region 906c. After the complete annealing of the implanted dopant, the introduced implantation dose and the masking 908 are the determine factors of the resistance value for the poly stripe, but not the profile of the poly stripe.

Figure 10A:
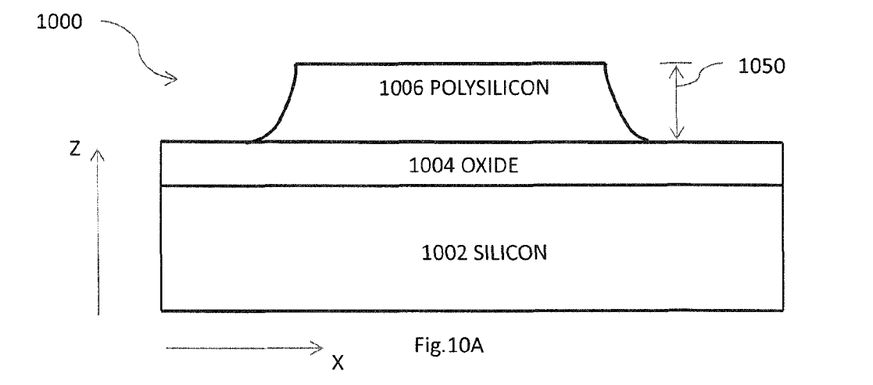
FIG. 10A depicts the polysilicon resistance temperature sensor after formation of a polysilicon layer in accordance with an aspect of the present disclosure.
Figure 10B:
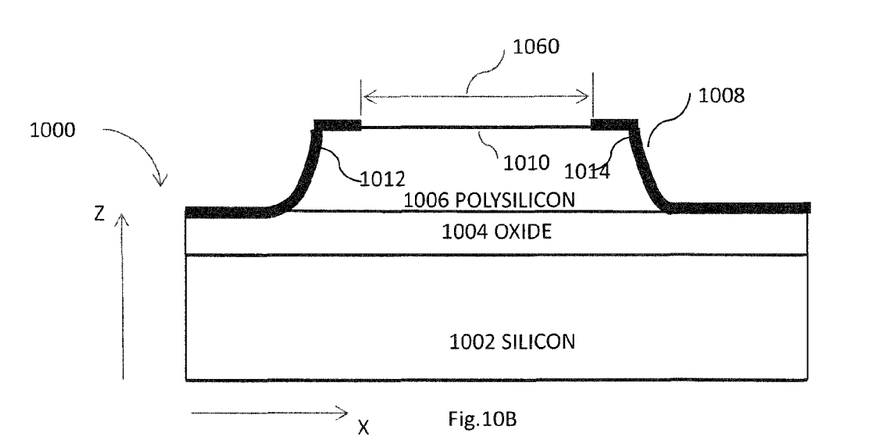
FIG. 10B depicts the polysilicon resistance temperature sensor after formation of an implantation mask in accordance with an aspect of the present disclosure.
Figure 10C:
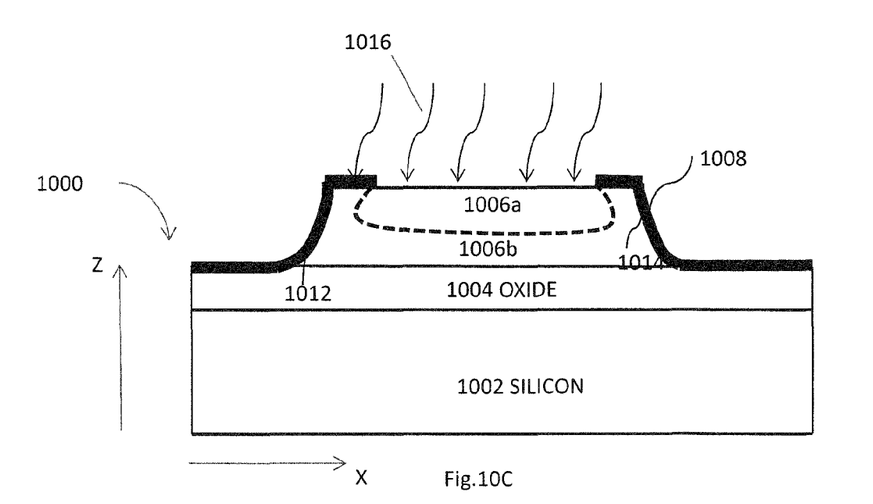
FIG. 10C depicts the polysilicon resistance temperature sensor after doping and diffusion in accordance with an aspect of the present disclosure.

FIGS. 10A, 10B and 10C depict a polysilicon resistance temperature sensor 1000 being fabricated according to another aspect of the current disclosure. The device 1000 provided in FIG. 10 is different from the device 800 illustrated in FIG. 8 and the device 900 illustrated in FIG. 9 in that the implanted dopant fulfills the polysilicon stripe 1006. By neglecting the surface effects and by assuming the doping concentration independent from charge carrier mobility, the dopants may also fill the entire poly stripe, but without losing phonons mobility.

FIG. 10A depicts the polysilicon resistance temperature sensor after formation of a polysilicon stripe 1006 in accordance with an aspect of the present disclosure. The polysilicon stripe 1006 is shown formed on an oxide layer 1004 by a suitable deposition process, while the oxide layer 1004 is over a semiconductor substrate or body 1002 comprised of silicon. The thickness 1050 of the deposited polysilicon stripe 1006 is not necessarily larger than the diffusion depth of the dopants implanted subsequently, since a dopant species which barely diffuses into the oxide layer 904 is selected, e.g. the dopant atoms can be arsenic atoms, phosphorus atoms and etc.

FIG. 10B illustrates the polysilicon resistance temperature sensor 1000 after formation of mask 1008 exposing a central portion of the polysilicon stripe 1006 in accordance with an aspect of the present disclosure. The resist mask 1008 has an opening 1010. The opening 1010 is typically uniformly spaced along the polysilicon resistor 1006 so as to facilitate uniform dopant distribution of implanted dopants in the longitudinal direction (y-direction) of the poly stripe 1006. The width 1060 of the opening 1010 can be varied. In one embodiment, the width 1060 is set to size $X_2$ to make sure that the implanted dopant lies completely within the polysilicon stripe 1006 and the diffused dopants fill the entire poly stripe 1006.

FIG. 10C illustrates the polysilicon resistance temperature sensor 1000 after ion implantation 1016 in accordance with an aspect of the present disclosure. The ion implantation 1016 implants a selected type of dopants, which will not diffuse into the oxide layer 1004 below the polysilicon stripe 1006. Typical such dopants can be, e.g. arsenic atoms, or phosphorus atoms. The dopants pass through the opening 1010, but are resisted in other portions by the resist mask 1008. As a result, only a portion of the ions directed at the opening 1010 are implanted into the polysilicon stripe, forming an implanted region 1006a. Subsequent to the ion implantation 1016, the resist mask 1008 is removed by a suitable process (e.g., chemical solution). Then, a thermal activation process is performed that diffuses the implanted dopant more uniformly through the entire polysilicon resistor 1006, forming a diffused region 1006b which reaches the flanks 1012 and 1014 of the poly stripe 1006.

Assuming that the doping concentration is approximately independent from charge carrier mobility, and by neglecting of surface effect, the resistance value in this approach is determined by the implantation dose and masking, but not by the structure of the poly stripe 1006, since the integral of the conductivity over the cross section area 1006 is independent from the distribution of the implanted dopant.

The above embodiments illustrated in FIGS. 8-10 have in common that the entire available dopants for current transportation are independent of the width and thickness of the poly stripe. The resistance is only affected by the well-controllable processes of masking and ion implantation. As a result, the width of the poly stripe can be reduced by a factor of 10. Since the poly stripe often has a length of several-hundred micro-meters, the reduction of the width of the poly stripe can save a significant surface area on the semiconductor device.

Further, the methods provided in the current disclosure is not limited to produce polysilicon resistance temperature sensors, but can also be applied to several applications of polysilicon resistors where high accurate resistors are needed.

For the application of polysilicon resistors as temperature sensors, an excellent temperature sensitivity of the polysilicon resistors is required, i.e. a strong temperature dependence of the resistors would be preferred. For this purpose, in some embodiments, deep energy level donors are implanted into the poly resistors, so that the substances inside the resistors contribute only a certain percentage to the conductivity at room temperature, but raise the conductivity significantly at higher temperature like e.g. 120° C. Typical such deep energy level donors are selected from e.g. selenium, sulfur or nitrogen, etc. These deep energy level donors increase the efficient concentration as temperature raises, which leads to a significant reduction of the resistivity of the resistor, or in other words, results an obvious increasing of the conductivity of the resistor, therefore, a more temperature-sensitive sensor is formed.

According to an aspect of the present disclosure, a method for producing a polysilicon resistor device is disclosed including: forming an undoped polysilicon layer by deposition, and defining at least a portion thereof as a polysilicon resistor region; pre-implanting deep energy level donors into the polysilicon resistor region, so as to amorphize or at least to partially amorphize the polysilicon resistor region; implant the amorphized or partially amorphized polysilicon resistor region with second dopant atoms; and annealing at least the polysilicon resistor region, so as to control the grain size in the polysilicon resistor region.

According to a further aspect of the present disclosure, the method further comprises forming an insulative layer beneath the polysilicon layer, wherein the insulative layer is an oxide layer, and it is over a semiconductor substrate. According to one aspect of the present disclosure, the deposited polisilicon layer has a thickness in a range of between 200 nm and 400 nm.

According to a further aspect of the present disclosure, the method further comprises forming contacts on ends of polysilicon resistor region, defining a contact region. The contacts can be any kind of conductivity contacts like, e.g. metal contacts. According to a further aspect of the present disclosure, deep energy level defects (or referred as deep level defects or deep defects) are formed by pre-implantation of deep level donors in the contact region, in order to reduce the Schottky bather in the contact region. Such deep energy level donors can be e.g. selenium, sulfur or nitrogen etc. Complementary or alternatively, shallow energy level atoms like phosphorus or arsenic atoms can be implanted resulting in a surface concentration exceeding $1 \times 10^{19}$ cm$^{-3}$. According to a further aspect of the present disclosure, a mask (e.g., a resist mask) is formed exposing a pre-defined subarea of the polysilicon resistor region.

According to an aspect of the present disclosure, a method for producing a polysilicon resistor device is disclosed having: forming an undoped polysilicon layer by deposition, and defining at least a portion thereof as a polysilicon resistor region; forming a mask (e.g., a resist mask) exposing a pre-defined subarea of the polysilicon resistor region; doping the polysilicon resistor region through the pre-defined subarea with dopant atoms; and creating diffusion of the dopant atoms, wherein the dopant atoms diffuse at most within said polysilicon resistor region of the polysilicon layer.

The pre-defined subarea may be a subarea in a central region of the polysilicon resistor region. According to an aspect of the present disclosure, the dopant atoms can be e.g. phosphorous atoms. According to an alternative aspect of the present disclosure, the dopant atoms are selected from atoms that do not diffuse into other layers. Such dopant atoms comprise e.g. phosphorous atoms and arsenic atoms. According to a further aspect of the present disclosure, the dopant atoms are selected from deep energy level donors, so as to reduce the temperature dependence of the resistivity of said polysilicon resistor region when working temperature increasing. Such deep energy level donors can be e.g. selenium, sulfur and nitrogen. According to a further aspect of the present disclosure, the dopant atoms are selected from deep energy level acceptors.

The diffusion of dopant atoms may be created by annealing of at least the polysilicon resistor region.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed:

1. A method for producing a polysilicon resistor device, comprising:
    forming a polysilicon layer;
    implanting first dopant atoms into at least a portion of said polysilicon layer, wherein the first dopant atoms comprise deep energy level donors, wherein the deep energy level donors are selected from a group consisting of selenium and sulfur;
    implanting second dopant atoms into said at least a portion of said polysilicon layer; and
    annealing said at least a portion of said polysilicon layer after implanting the first and second dopant atoms.

2. The method of claim 1, wherein said at least a portion of said polysilicon layer is configured as a polysilicon resistor region.

3. The method of claim 2, wherein implanting said first dopant atoms into said at least a portion of said polysilicon layer at least partially amorphizes said polysilicon resistor region.

4. The method of claim 3, wherein annealing said at least a portion of said polysilicon layer controls a grain size in said polysilicon resistor region and activates at least part of the implanted second dopant atoms.

5. The method of claim 3, wherein the annealing is controlled to partially recrystallize said at least partially amorphized polysilicon resistor region.

6. The method of claim 2, wherein the deep energy level donors inhibit a complete recrystallization of said polysilicon resistor region during the annealing process.

7. The method of claim 2, further comprising forming contacts on ends of said polysilicon resistor region, defining a contact region.

8. The method of claim 7, wherein said contacts are metal contacts.

9. The method of claim 7, further comprising forming deep energy level defects in the contact region.

10. The method of claim 2, further comprising forming an implantation mask over the polysilicon layer before implanting the first dopant atoms, the implantation mask exposing a pre-defined subarea of said polysilicon resistor region.

11. The method of claim 1, wherein forming said polysilicon layer comprises forming said polysilicon layer as an undoped layer.

12. The method of claim 1, wherein forming said polysilicon layer is implemented by depositing polysilicon over an insulative layer.

13. The method of claim 12, wherein the deposited polysilicon has a thickness in a range of between 200 nm and 400 nm.

14. The method of claim 1, wherein an energy difference between the deep energy level donors and a conduction band edge is higher than 200 meV.

15. The method of claim 1, wherein said second dopant atoms are selected from a group composed of phosphorous atoms and arsenic atoms.

16. A method for producing a polysilicon resistor device, comprising:
forming a polysilicon layer;
implanting first dopant atoms into at least a portion of said polysilicon layer, wherein the first dopant atoms comprise deep energy level donors;
implanting second dopant atoms into said at least a portion of said polysilicon layer;
annealing said at least a portion of said polysilicon layer after implanting the first and second dopant atoms, wherein at least a portion of said polysilicon layer is configured as a polysilicon resistor region;
forming contacts on ends of said polysilicon resistor region, defining a contact region; and
forming deep energy level defects in the contact region, wherein forming deep energy level defects is implemented by implantation of third dopant atoms into the contact region, wherein the third dopant atoms comprise deep energy level donors.

17. The method of claim 16, wherein the deep energy level donors implanted into the contact region are selected from a group composed of selenium, sulfur, and nitrogen.

* * * * *